United States Patent [19]

Jeon

[11] Patent Number: 5,409,860

[45] Date of Patent: Apr. 25, 1995

[54] METHOD OF MANUFACTURING A METAL CONTACT ON A WORD LINE

[75] Inventor: Yong-Joo Jeon, Kyoungki-do, Rep. of Korea

[73] Assignee: Hyundai Electronics Industries Co., Ltd., Kyoungki-do, Rep. of Korea

[21] Appl. No.: 91,063

[22] Filed: Jul. 14, 1993

[30] Foreign Application Priority Data

Jul. 14, 1992 [KR] Rep. of Korea ............... 92-12479

[51] Int. Cl.$^6$ ................ H01L 21/44; H01L 21/48
[52] U.S. Cl. .................... 437/195; 437/52; 437/193; 437/200
[58] Field of Search ............ 437/904, 200, 195, 52, 437/919, 60, 193; 148/DIG. 19, DIG. 20

[56] References Cited

U.S. PATENT DOCUMENTS 5,043,781 8/1991 Nishiura et al. ............... 437/904
5,059,554 10/1991 Spinner et al. ............... 437/193
5,213,992 5/1993 Lu ............................ 437/52

OTHER PUBLICATIONS

Wolf, Silicon Processing for VLSI GRA, vol. 2, Lattice press 1990 pp. 587–600, 428–434, 277–278.
Ghandhi VLSI Fabrication Principles, pp. 591–592.

*Primary Examiner*—Olik Chaudhuri
*Assistant Examiner*—H. Jey Tsai
*Attorney, Agent, or Firm*—Popham, Haik, Schnobrich & Kaufman, Ltd.

[57] ABSTRACT

A metal contact is manufactured on a word line that is capable of isolating a metal from a semiconductor substrate by forming an active area having the injected impurity which is different from that of the semiconductor substrate formed on the semiconductor substrate of both sides of the word line.

3 Claims, 5 Drawing Sheets

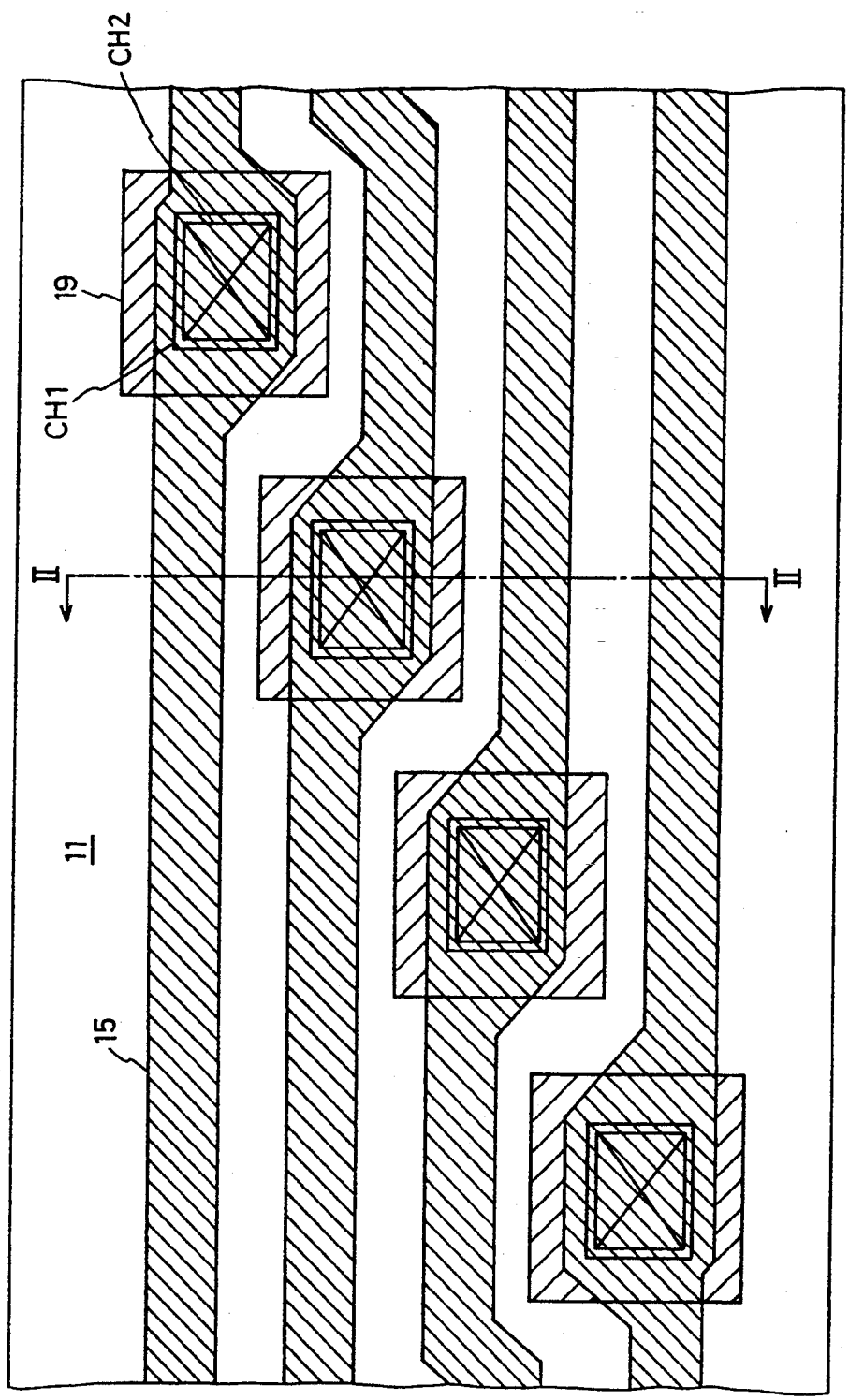
Fig. 1 "Prior Art"

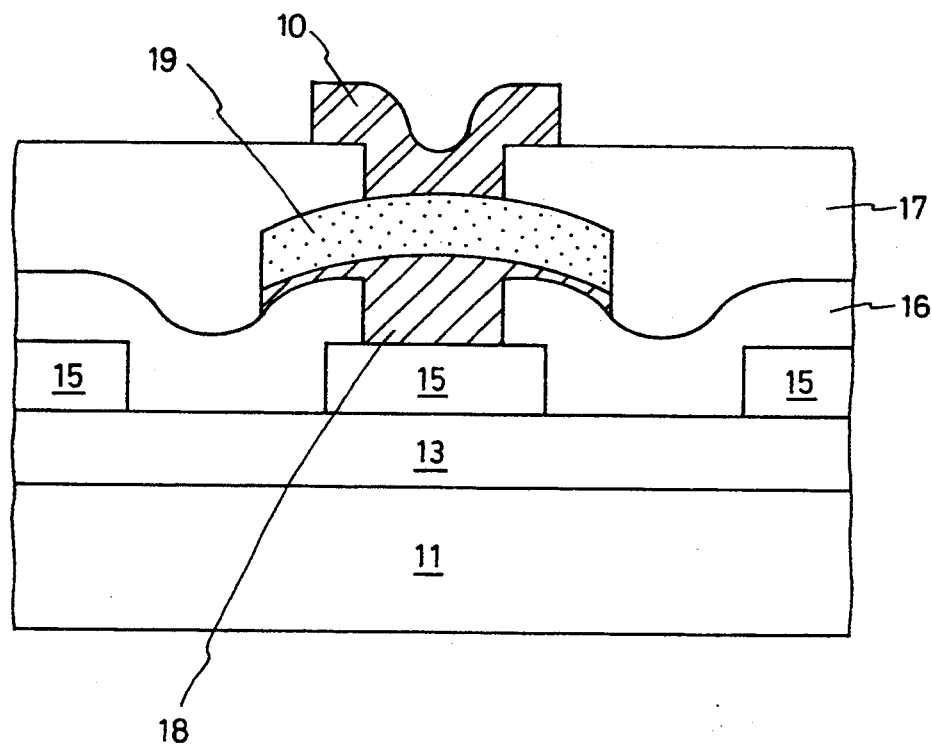
Fig. 2  "Prior Art"
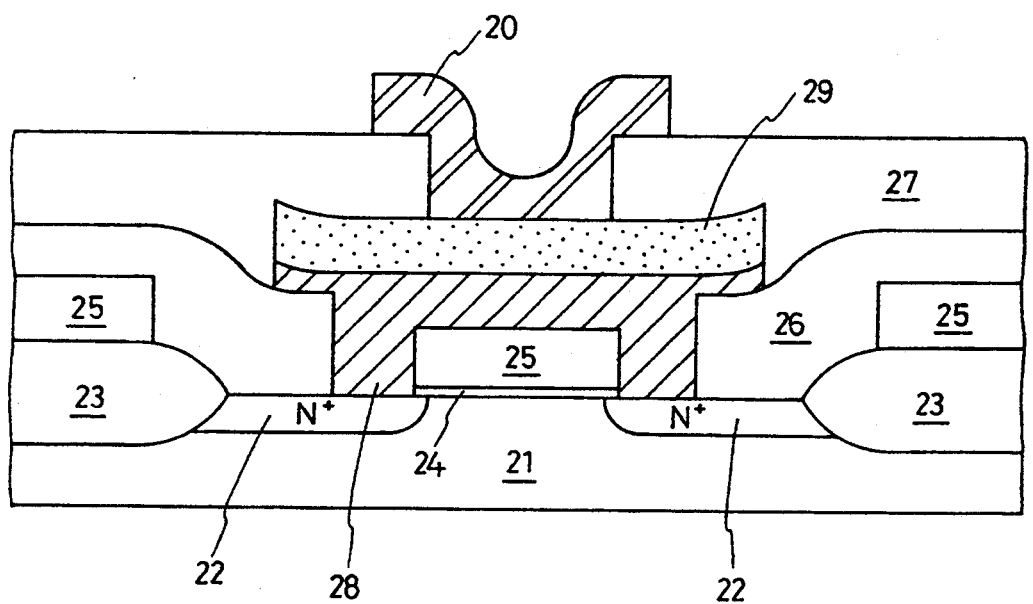
Fig. 4

METHOD OF MANUFACTURING A METAL CONTACT ON A WORD LINE

BACKGROUND OF THE INVENTION

1. Field of the Invention

This invention relates to a method for manufacturing a metal contact on a word line during a manufacturing process of a Dynamic Random Access Memory (DRAM) cell, and more particularly to a method for manufacturing a metal contact on a word line that is capable of isolating a metal from a semiconductor substrate by forming an active area having the injected impurity which is different from that of the semiconductor substrate formed on the semiconductor substrate of both sides of the word line.

2. Information Disclosure Statement

Generally, a N-type polysilicon that contains phosphorous as an impurity is used for a word line of a semiconductor memory device. In such case, the resistance of the polysilicon can be decreased somewhat by injecting the impurity on the semiconductor substrate. However, the resistance is still very high as compared with that of a metal. Accordingly, the signal speed decreases due to the resistance of the word line.

For solving the above mentioned problem, a method of depositing metal layers with a certain interval over the word line is used frequently. However, in a process for manufacturing the metal contact on the word line, the design rule is reduced as a highly integrated DRAM cell is manufactured. Moreover, as the topology is increased, the depth of the contact hole is deepened so that it is difficult to manufacture a highly integrated DRAM cell.

FIG. 1 is a layout illustrating a metal contact on a word line according to the conventional method. FIG. 2 is a cross-sectional view showing a method for manufacturing a metal contact on a word line along II—II of FIG. 1. As shown in FIG. 1 and 2, a metal layer 10 is not directly connected to the word line 15, but the metal layer 10 is connected to a polycide 13 through a metal contact hole after a polysilicon layer 18 and a polycide 19 are sequentially formed and connected to the word line 15.

In the following section, a method for manufacturing the metal contact on the word line 15 according to the conventional method is further explained.

After forming a field oxide layer 13 on a P-well area 11 formed on a silicon substrate (not illustrated), a word line 15 which is comprised of a polysilicon is formed on the field oxide layer 13. Thereafter, a first interpoly oxide layer 16 is deposited over the entire surface and a contact hole for a bit line is formed by etching the predetermined part of the first interpoly oxide layer 16 through a photo etching process utilizing a bit line as a contact mask (not illustrated). After that, a polysilicon layer 18 for a bit line is formed by depositing a polysilicon in a contact hole for a bit line. Then, a polycide layer 19 for a bit line is deposited on the polysilicon layer 18 and a second interpoly oxide layer 17 is deposited over the entire surface. Thereafter, a metal contact hole is formed by etching the predetermined part of the second interpoly oxide layer 17 and a metal layer 10 is formed by depositing a metal in the metal contact hole. Therefore, the metal layer 10 is connected to the polycide layer 19.

In a method for manufacturing a metal contact on a word line according to the conventional technique, since the size of a DRAM cell is reduced as its integrate increases, it is difficult to make a design rule. Also, although the width of the word line of the part where the metal contact is to be formed is decreased, the contact size is restricted due to the reduction of the design rule because the contact must be formed over the word line. In such case, when the word line fails to cover entirely the contact of the bit line, the substrate and metal layer on the word line come into contact so that the leakage of the signal is occurred.

Accordingly, as the design rule is decreased, the contact size must be also decreased. However, as a highly integrated DRAM cell is manufactured, the contact depth is increased and the metal contact cannot effectively be used. To solve these problems, although the contact of the bit line is inserted in the middle to decrease the topology, the contact size of the bit line is limited.

SUMMARY OF THE INVENTION

It is an object of this invention to provide a metal contact on a word line that is capable of isolating a metal from a semiconductor substrate by forming an active area having the injected impurity which is different from that of the semiconductor substrate formed on the semiconductor of both sides of the word line.

BRIEF DESCRIPTION OF THE DRAWINGS

FIG. 1 is a layout illustrating a metal contact on a word line according to the conventional method.

FIG. 2 is a cross-sectional view showing a method for manufacturing a metal contact on a word line along II—II of FIG. 1.

FIG. 4 is a cross-sectional view showing a method for manufacturing a metal contact on a word line along IV—IV of FIG. 3.

DETAILED DESCRIPTION OF THE INVENTION

The embodiment of this invention will now be described in detail by referring to the accompanying drawings.

Figure 3:
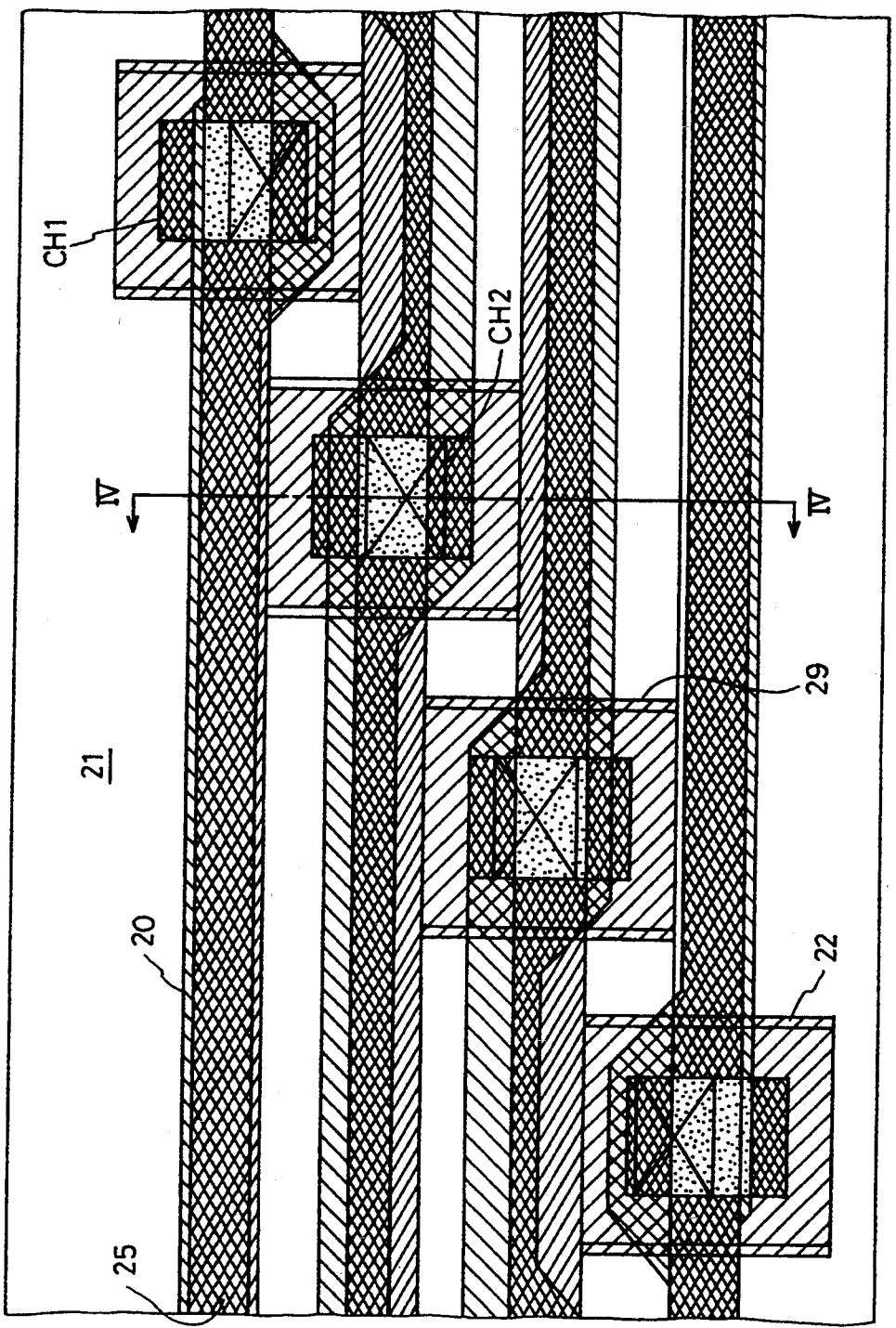
FIG. 3 is a layout illustrating a metal contact on a word line according to the first embodiment of the present invention.

FIG. 3 is a layout illustrating a metal contact on a word line according to the first embodiment of the present invention. FIG. 4 is a cross-sectional view showing a method for manufacturing a metal contact on a word line along IV—IV of FIG. 3. As shown in FIGS. 3 and 4, a field oxide layer 23 and N+ active area 22 are formed on a P-well area 21 formed in a semiconductor substrate (not illustrated) and a gate oxide layer 24 is formed on the P-well of the part where the field oxide layer 23 is not formed. Moreover, a word line 25 is formed on the gate oxide layer 24 between the N+ active areas 22, the word line 25 is also formed on the field oxide layer 23, and a first interpoly oxide layer 26 is formed over the entire surface. Furthermore, the predetermined part of the first interpoly oxide layer 26 is etched so that a contact hole for a bit line is formed, and a polysilicon layer 28 for a bit line is formed by depositing a polysilicon in the contact hole for a bit line. Thereafter, a polycide layer 29 for a bit line is formed on the polysilicon layer 28 and a second interpoly oxide layer 27 is formed over the entire surface. Finally, a metal layer 20 is formed by depositing a metal in a metal contact hole formed by etching the predetermined part of the second interpoly oxide layer 27 so that the metal layer 20 is connected to the polycide 29.

Figure 5:
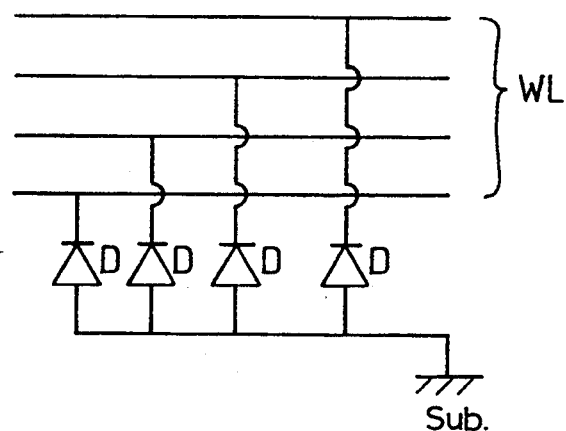
FIG. 5 is an equivalent circuit diagram that corresponds to the first embodiment of the present invention.

FIG. 5 is an equivalent circuit diagram that corresponds to the first embodiment of the present invention. As shown in FIG. 5, a Diode (D) formed between the active area and semiconductor substrate is connected to each word line (WL). Accordingly, when the DRAM cell is operated, the voltage applied to the word lines turns into reverse voltage so that the word signal does not leak into the semiconductor substrate.

Figure 6A:
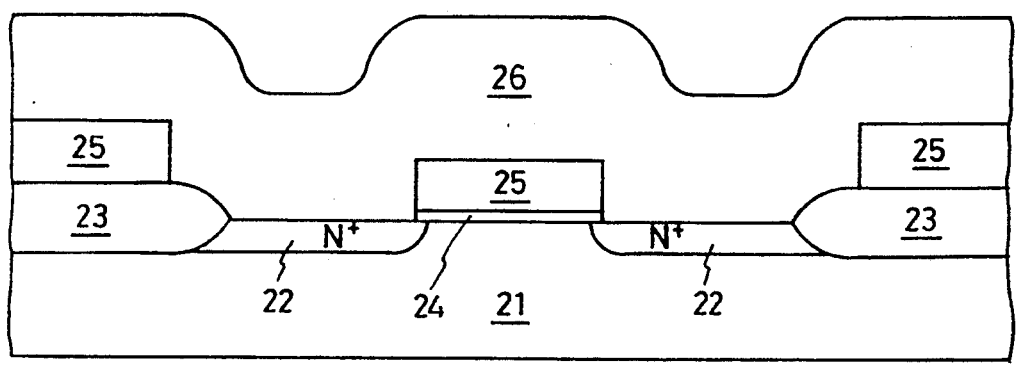
FIG. 6a through 6c are cross-sectional views illustrating a manufacturing method of FIG. 4 as several steps.
Figure 6B:
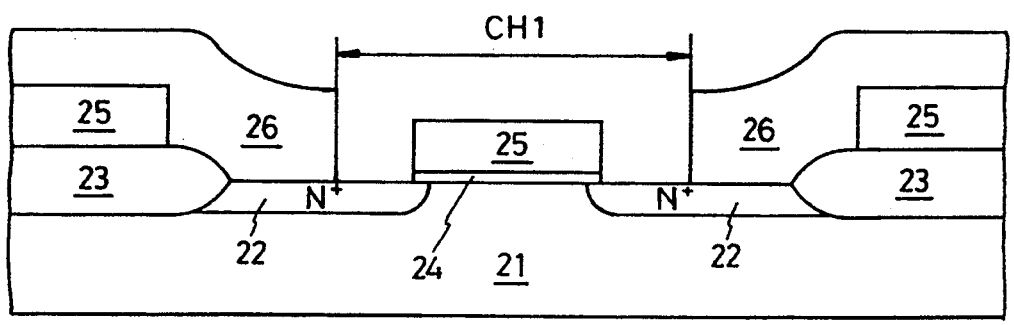
Figure 6C:
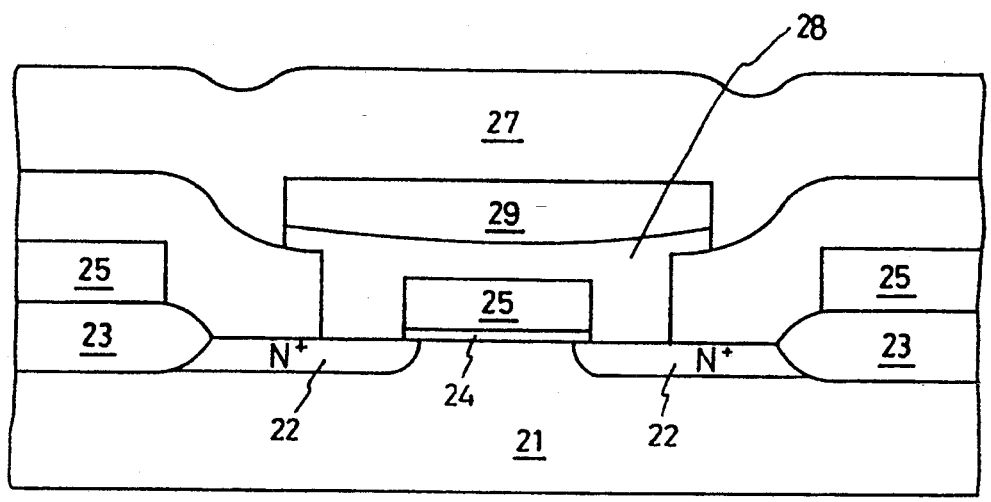

FIG. 6a through 6c are cross-sectional views illustrating a manufacturing method shown in FIG. 4 as several steps. As shown in FIG. 6a, after a field oxide layer 23 is formed on the predetermined part of a P-well area 21, a gate oxide layer 24 is formed on the P-well area 21 of the part where the field oxide layer 23 is not formed. Thereafter, a polysilicon layer is deposited on the entire surface and the predetermined part of the polysilicon layer is etched out by a photo etching process so that a word line 25 is formed. Then, by using the word line 25 as a mask, N+ active area 22 is formed by injecting the impurity on the P-well area 21, and a first interpoly oxide layer 26 is formed over the entire surface. In such case, an arsenic instead of the field oxide layer is injected on the substrate so that N+ active area 21 is formed. At this time, a process which injects ions is performed after self-aligned by the word line 25 without a mask.

As shown in FIG. 6b, the first interpoly oxide layer 26 of the part where the bit line is formed is etched by a photo etching process so that a contact hole CH1 for a bit line is formed. In such case, the contact hole CH1 is formed over the word line 25 and the size of the contact hole CH1 becomes larger than the width of the word line 25.

As shown in FIG. 6c, a polysilicon layer 28 for a bit line is formed by depositing a polysilicon in the contact hole CH1, and a polycide layer 29 for a bit line is formed on the polysilicon layer 28. In a method for filling a contact hole CH1, a polysilicon is deposited over the entire surface and a polysilicon layer 28 is formed by entirely etching without a mask to leave the polysilicon in the contact hole CH1. Moreover, the polycide layer 29 is deposited to make the topology of the polysilicon layer 28 connected to the metal smoother so that the polycide layer 29 is easily connected to the metal in the next process. Thereafter, the second interpoly oxide layer 27 is formed on the entire surface, and the predetermined part of the second interpoly oxide layer 27 on the polycide layer 29 is removed so that a metal contact hole is formed. After that, a metal contact is completely formed by carrying out the next process.

Figure 7:
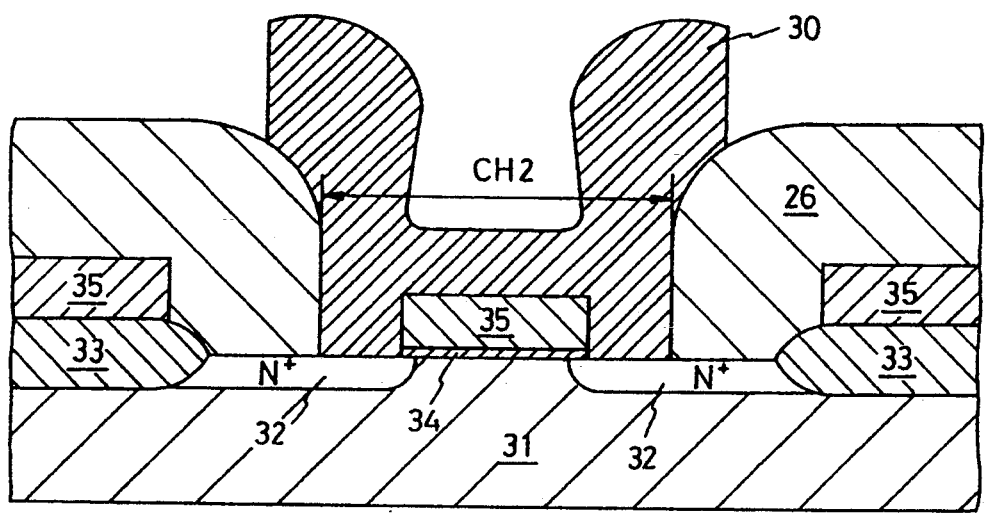
FIG. 7 is a cross-sectional view illustrating a method for manufacturing a metal contact on a word line according to the second embodiment of the present invention.

FIG. 7 is a cross-sectional view illustrating a method for manufacturing a metal contact on a word line according to the second embodiment of the present invention. As shown in FIG. 7, a metal layer 30 is directly connected to a word line 35 without using the contact of the bit line. In such case, a field oxide layer 33, a gate oxide layer 34, and a N+ active area 32 is formed on a P-well area 31, and the word line 35 is formed using a polysilicon on the gate oxide layer 34 and the field oxide layer 33. Moreover, a first interpoly oxide layer 36 is formed over the entire surface, and the predetermined part of the first interpoly oxide layer is etched by a photo etching process so that a contact hole CH2 is formed. Furthermore, a metal layer 30 is formed by depositing a metal in a contact hole CH2. Therefore, the metal layer 30 is connected to the N+ active area 32. In such case, since the metal layer 30 must cover fully the inside of the metal contact hole CH2, the size of the contact hole can not be increased. However, a flexibility on misalignment during the process is increased when the same size of the contact hole is given.

As described so far, the method for manufacturing the metal contact on the word line can increase the contact size, and the sufficient interval between the word lines can be formed.

What is claimed is:

1. A method for manufacturing a metal contact on a word line in a strapping region comprising the steps of:
    forming a P-well area on a semiconductor substrate;
    forming a field oxide layer on a part of said P-well area;
    forming a gate oxide layer on said P-well area where said field oxide layer is not formed;
    forming a polysilicon layer over the entire surface;
    etching said polysilicon layer so that a word line formed;
    forming a N+ active area by injecting an impurity on a part of said P-well using said word line as a mask;
    forming a first interpoly oxide layer over the entire surface;
    etching a part of said first interpoly oxide layer form a contact hole for both a word line and a bit line;
    forming a polysilicon layer over the entire surface and etching the region other than said word line contact hole and bit line contact hole for preparing a contact for a bit line and contact pad for the word line;
    forming a polycide layer on said contact pad formed in said word line contact hole simultaneously with forming a polycide layer for a bit line by using a depositing and an etching step;
    forming a second interpoly oxide layer over the entire surface;
    etching said second interpoly oxide layer in the region in which said word line is positioned so that a contact hole for a word line metal contact is formed; and
    forming a metal layer by depositing a metal in said contact hole so that said metal layer is connected to said polycide.

2. A method for manufacturing a metal contact on a word line in a strapping region comprising the steps of:
    forming a N−well area on a semiconductor substrate;
    forming a field oxide layer on a part of a P-well area;
    forming a gate oxide layer on said P-well area where said field oxide layer is not formed;
    forming a polysilicon layer over the entire surface;
    etching a part of said polysilicon layer so that a word line is formed;
    forming a N+ active area by injecting an impurity on a part of said P-well using said word line as a mask;
    forming a interpoly oxide layer over the entire surface;

etching a part of said interpoly oxide layer in order to form a contact hole for both a word line and a bit line; and forming a metal contact in said contact hole by depositing and partially etching a metal layer so that said metal layer is directly connected to said word line.

3. A method for manufacturing a metal contact on a word line in a strapping region comprising the steps of:

forming an N⁻well area on a semiconductor substrate;

forming a field oxide layer on a part of said N⁻well area;

forming a gate oxide layer on said N⁻well area where said field oxide layer is not formed;

forming a polysilicon later over the entire surface;

etching said polysilicon layer so that a word line formed;

forming a P+ active area by injecting an impurity on a part of said N⁻well using said word line as a mask;

forming a first interpoly oxide layer over the entire surface;

etching a part of said first interpoly oxide layer so that a contact hole for both a word line and a bit line is formed;

forming a polysilicon layer over the entire surface and etching the region other than said word line contact hole and bit line contact hole for preparing a contact for a bit line and contact pad for the word line;

forming a polycide layer on said contact pad formed in said word line contact hole simultaneously with forming a polycide layer for a bit line by using a depositing and an etching step;

forming a second interpoly oxide layer over the entire surface;

etching said second interpoly oxide layer in the region in which said work line is positioned so that a contact, hole for a word line metal contact is formed; and forming a metal layer by depositing a metal in said contact hole so that said metal layer is connected to said polycide.

\* \* \* \* \*